(12) United States Patent
Jahier Pagliari et al.

(10) Patent No.: US 10,193,553 B2
(45) Date of Patent: Jan. 29, 2019

(54) PROCESSING CIRCUIT CAPABLE OF DYNAMICALLY MODIFYING ITS PRECISION

(71) Applicant: Commissariat á l'Energie Atomique et aux Energies Alternatives, Paris (FR)

(72) Inventors: Daniele Jahier Pagliari, Luserna San Giovanni (IT); Edith Beigne, Meaudre (FR); Yves Durand, Saint-Ismier (FR); Massimo Poncino, Turin (IT)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/927,027

(22) Filed: Mar. 20, 2018

(65) Prior Publication Data

US 2018/0278250 A1 Sep. 27, 2018

(30) Foreign Application Priority Data

Mar. 21, 2017 (FR) ...................................... 1752325

(51) Int. Cl.
*H03K 19/00* (2006.01)
*G06F 7/38* (2006.01)
*H03K 3/011* (2006.01)

(52) U.S. Cl.
CPC ........... *H03K 19/0016* (2013.01); *G06F 7/38* (2013.01); *H03K 3/011* (2013.01); *G06F 2207/382* (2013.01); *H03K 2217/0018* (2013.01)

(58) Field of Classification Search
None
See application file for complete search history.

(56) References Cited

U.S. PATENT DOCUMENTS

| 6,140,686 A | 10/2000 | Mizuno | |
|---|---|---|---|
| 7,816,742 B1 * | 10/2010 | Koniaris | H01L 21/743 257/371 |
| 8,370,658 B2 * | 2/2013 | Sheng | G06F 1/3203 713/320 |
| 9,405,340 B2 * | 8/2016 | Ganesan | G06F 1/26 |
| 2009/0072857 A1 | 3/2009 | Perisetty | |

OTHER PUBLICATIONS

Preliminary Search Report for French Application No. FR1752325 dated Dec. 6, 2017, 2 pages.

(Continued)

*Primary Examiner* — Jeffery S Zweizig
(74) *Attorney, Agent, or Firm* — Moreno IP Law LLC

(57) ABSTRACT

The invention concerns a circuit comprising: a processing circuit (102) comprising a plurality of circuit domains (103), each circuit domain (103) comprising a plurality of transistors and being configured to apply one or more corresponding transistor biasing voltages to said transistors; and a control circuit (104) configured to determine, based on at least a selected accuracy setting of the processing circuit, the level of said one or more transistor biasing voltages to be applied in each of said circuit domains, the control circuit (104) being further configured to cause said transistor biasing voltages to be applied to the circuit domains.

12 Claims, 5 Drawing Sheets

(56) References Cited

OTHER PUBLICATIONS

Moons et al., "DVAS: Dynamic Voltage Accuracy Scaling for increased energy-efficiency in approximate computing," 2015 IEEE/ACM International Symposium on Low Power Electronics and Design, Jul. 22, 2015, pp. 237-242.

Kahng et al., "Slack Redistribution for Graceful Degradation Under Voltage Overscaling," Proceedings of the 2010 Asia and South Pacific Design Automation Conference, Jan. 18, 2010, pp. 825-831.

Huang, et al., "A Methodology for Energy-Quality Tradeoff Using Imprecise Hardware," Proceedings of the 49th Annual Design Automation Conference, Jun. 3, 2012, pp. 504-509.

Kahng et al., "Accuracy-Configurable Adder for Approximate Arithmetic Designs," Proceedings of the 49th Annual Design Automation Conference, Jun. 3, 2012, pp. 820-825.

Kyaw et al., "Low-Power High-Speed Multiplier for Error-Tolerant Application," 2010 IEEE International Conference of Electron Devices and Solid-State Circuits (EDSSC), Dec. 15, 2017, 4 pages.

Liu et al., "A Low-Power, High-Performance Approximate Multiplier with Configurable Partial Error Recovery," 2014 Design, Automation & Test in Europe Conference & Exhibition (DATE), Mar. 24, 2014, 4 pages.

Shin et al., "A Re-Design Technique for Datapath Modules in Error Tolerant Applications," Asian Test Symposium 2008, Nov. 24, 2008, pp. 431-437.

Venkataramani et al., "SALSA: Systematic Logic Synthesis of Approximate Circuits," Proceedings of the 49th Annual Design Automation Conference, Jun. 3, 2012, pp. 796-801.

\* cited by examiner

PROCESSING CIRCUIT CAPABLE OF DYNAMICALLY MODIFYING ITS PRECISION

FIELD

The present disclosure relates to the field of digital circuit conception and to a processing circuit capable of dynamically modifying its precision.

BACKGROUND

In recent years, research interest has focussed on adequate hardware circuit design. According to this design methodology, a circuit architecture is designed to be reconfigurable at runtime such that it can support multiple accuracy settings. This leads to corresponding power benefits at lower accuracies. Indeed, the longest and thus most critical timing paths of a processing circuit generally concern the least significant bit (LSB) of input data. Thus by reducing the number of bits of input data of the processing circuit that are processed, for example from 32 bits to 16 bits or less, certain operating conditions of the circuit can be relaxed, such as the supply voltage, leading to reduced power consumption, and/or the operating frequency can be increased. Power reduction also results from reduced switching activity in view of the unused input bits.

For example, the publication by Bert Moons and Marian Verhelst entitled "DVAS: Dynamic Voltage Accuracy Scaling for Increased Energy-Efficiency in Approximate Computing", ISLPED, p. 237-242, Rome, 2015, proposes a technique allowing runtime-reconfigurable accuracy. In particular, DVAS consists in concurrently scaling the supply voltage of a circuit and reducing the number of used input bits. The bit width reduction allows to cope with the increased timing delay due to voltage scaling, by avoiding stimulation of the longest timing paths in the circuit.

The main limitation of DVAS systems is the phenomenon known as "Wall-of-Slack", according to which, during synthesis, cells that belong to short paths are optimized for power and area by downsizing them. This leads to creating many "almost critical" paths, and therefore as soon as the supply voltage is reduced, timing violations will occur in a large percentage of the total paths.

Another limitation of DVAS is that, due to the different parts of the circuit operating at different supply voltages, it becomes necessary to insert level shifters at different places in the circuit design, adding complexity, power consumption and surface area.

SUMMARY

It is an aim of embodiments of the present disclosure to at least partially address one or more limitations in the prior art.

According to one aspect, there is provided a circuit comprising: a processing circuit comprising a plurality of circuit domains, each circuit domain comprising a plurality of transistors and being configured to apply one or more corresponding transistor biasing voltages to said transistors; and a control circuit configured to determine, based on at least a selected accuracy setting of the processing circuit, the level of said one or more transistor biasing voltages to be applied in each of said circuit domains, the control circuit being further configured to cause said transistor biasing voltages to be applied to the circuit domains.

According to one embodiment, the control circuit is configured to determine the level of said one or more biasing voltages based further on: a supply voltage setting of all or part of the processing circuit; or a frequency setting of all or part of the processing circuit; or both a supply voltage setting and a frequency setting of all or part of the processing circuit.

According to one embodiment, the circuit further comprises: a configuration memory storing, for a plurality of accuracy settings of the processing circuit, an indication of the level of said one or more transistor biasing voltages for each of the circuit domains, the control circuit being adapted to access the configuration memory in order to determine the level of the one or more transistor biasing voltages to be applied by each of the circuit domains.

According to one embodiment, the configuration memory further stores, for the plurality of accuracy settings, an indication of a supply voltage setting of all or part of the processing circuit and/or an indication of a frequency setting of all or part of the processing circuit.

According to one embodiment, the circuit further comprises a further control circuit adapted to apply a supply voltage setting and/or a clock frequency setting to the plurality of circuit domains.

According to a further aspect, there is provided a method of conception of the above circuit, comprising: generating or receiving, by a processor of a computing device, a first circuit topology of the processing circuit, the first circuit topology defining a layout of cells forming the processing circuit; generating, by the processor, a second circuit topology of the processing circuit comprising the plurality of circuit domains, and assigning the cells of the processing circuit to corresponding circuit domains of the plurality of circuit domains; and storing, by the processor, the second circuit topology in a memory of the computing device.

According to one embodiment, the method further comprises fabricating the processing circuit based on the second circuit topology.

According to one embodiment, generating the second circuit topology comprises: dividing, by the processor, the area of the first circuit topology into N zones, where N is an integer of 2 or more equal to the number of circuit domains; assigning, by the processor, the cells of the processing circuit in the first circuit topology to the corresponding circuit domains based on the location of each cell; performing a place and route operation on the second circuit topology.

According to one embodiment, generating the second circuit topology comprises: a) generating, by the processor and for a given accuracy configuration of the processing device, a single-cell threshold voltage assignment for cells forming the processing circuit in the first circuit topology; b) executing a clustering algorithm to group together cells of the single-cell biasing voltage assignment to define a set of circuit domains; c) repeating a) and b) for at least a plurality of accuracy configurations of the processing circuit; and d) generating a single set of circuit domains for the second circuit topology based on the set of circuit domains defined for each accuracy configuration.

According to one embodiment, the method further comprises storing to the configuration memory transistor biasing voltage settings to be applied to the circuit domains for each of a plurality of accuracy configurations.

According to one embodiment, the method further comprises generating the transistor biasing voltage settings based on static timing analysis.

According to a further aspect, there is provided a method of dynamically modifying accuracy of a processing circuit comprising a plurality of circuit domains, each circuit domain comprising a plurality of transistors, the method comprising: determining, by a control circuit based on at least a selected accuracy setting of the processing circuit, a level of one or more transistor biasing voltages for each of the plurality of circuit domains; and applying to the transistor devices of the plurality of circuit domains the one or more transistor biasing voltages.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION OF THE PRESENT EMBODIMENTS

Throughout the present disclosure, the following terms are given the following definitions:

circuit domain—a grouping of cells of an integrated circuit sharing one or more common transistor biasing voltages;

transistor biasing voltage—a voltage applied as a body biasing voltage to a CMOS bulk transistor or as a back gate biasing voltage to an SOI (silicon on insulator) transistor (also known as a fully depleted SOI (FDSOI) transistor) thereby causing a modification to the gate threshold voltage VT of the transistor;

VT setting or level—a value causing a circuit domain to apply one or more transistor biasing voltage levels to its transistors in order to impose a given transistor threshold voltage level VT to some or all transistors in the circuit domain;

forward body/back biasing (FBB)—the application of transistor biasing voltages to PMOS and NMOS transistors in order to lower their threshold voltage VT and increase performance by increasing their speed. The FBB voltages applied to the NWELLs and PWELLs of PMOS/NMOS transistors may be different and for example depend on the particular transistor technology;

reverse body/back biasing (RBB)—the application of a transistor biasing voltages to PMOS and NMOS transistors in order to increase their threshold voltage VT and reduce power consumption by reducing leakage currents. Again, the RBB voltages applied to the NWELLs and PWELLs of PMOS/NMOS transistors may be different and for example depend on the particular transistor technology;

cell—one or more transistors forming a circuit having a particular function; and processing circuit—any digital circuit, synchronous or asynchronous, configured to processes input data and generate output data.

Figure 1:
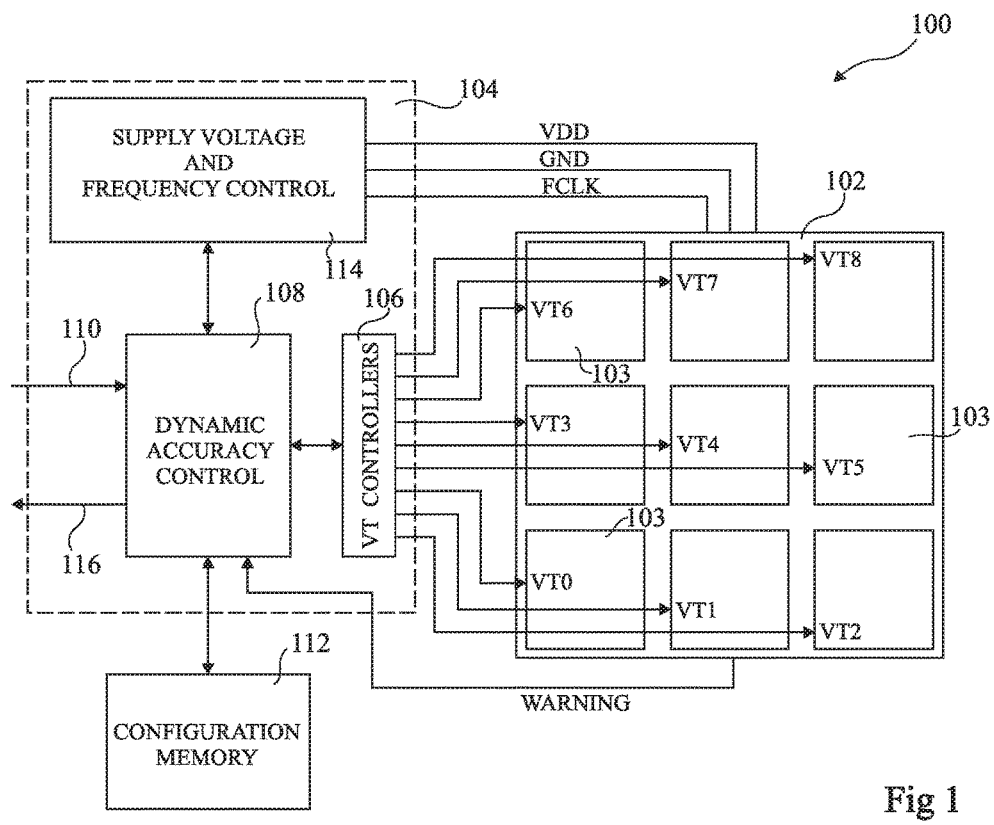
FIG. 1 schematically illustrates a processing circuit according to an example embodiment of the present disclosure.

FIG. 1 schematically illustrates a circuit 100 according to an example embodiment, comprising a processing circuit 102 divided into N circuit domains 103, where N is for example an integer equal to two or more. In the example of FIG. 1, the processing circuit 102 comprises nine circuit domains. The circuit 100 further comprises a control circuit 104 for controlling the transistor biasing voltages applied in each of the circuit domains 103. In some embodiments, the control circuit 104 also controls the level of the supply voltage VDD applied to the processing circuit 102 and/or the frequency of the clock signal FCLK provided to the processing circuit 102.

The control circuit 104 comprises VT controllers (VT CONTROLLERS) 106, which for example generate VT control signals VT0 to VT8 for the nine circuit domains respectively. Each of the VT control signals for example indicates the VT level to be applied to the transistors of the corresponding circuit domain. For example, the VT control signals may indicate whether the transistors are to have a "High VT" or "Low VT". While not illustrated in FIG. 1, each circuit domain for example comprises a transistor biasing circuit adapted to apply appropriate transistor biasing voltages to its transistors based on the VT control signal. For example, the biasing circuits are used to apply the transistor biasing voltages to the back biasing terminals of the transistors of each circuit domain. For example, the biasing circuits are coupled to the n-type and p-type wells of the PMOS/NMOS transistors of each circuit domain via well taps, as known by those skilled in the art. In some embodiments, the transistor biasing voltages are pre-generated, and the biasing circuit of each domain comprises, for each VT level, a power switch coupling the back biasing terminals of the cells to the corresponding pre-generated voltage source. For example, the pre-generated voltage sources are generated by a voltage regulator or charge pump (not illustrated).

The VT control signals provided to each of the circuit domains 103 can be controlled independently, whereas the supply voltage level VDD and/or the clock frequency FCLK are for example common for all of the circuit domains 103.

The control circuit 104 also for example comprises a dynamic accuracy control circuit (DYNAMIC ACCURACY CONTROL) 108, which receives on an input line 110 an accuracy setting to be applied to the processing circuit 102. In some embodiments, the dynamic accuracy control circuit 108 may further receive one or more other settings to be applied to the processing circuit 102. For example, the level of the supply voltage VDD may be provided to the circuit 108 as a setting, for example because the supply voltage is shared with and thus imposed by external circuits. Additionally or alternatively, the clock frequency may be decided by external factors and provided to the circuit 108 as a setting.

The control circuit 104 is for example coupled to a configuration memory (CONFIGURATION MEMORY) 112, which for example stores an indication of the VT settings to be applied based on at least the accuracy setting, and optionally based on a supply voltage setting and/or a clock frequency setting. The configuration memory 112 for example stores, for each accuracy level, an indication of the VT level to be applied in each of the circuit domains in order to achieve the accuracy level without creating timing violations and while also having relatively low power consumption.

Table I below provides an example of the contents of the configuration memory 112, assuming in this example that there are four circuit domains receiving corresponding VT control signals VT0 to VT3. In this table, the term "Low VT" indicates FBB transistor biasing that causes the transistors in the corresponding circuit domain to have a relatively low threshold voltage and thus high speed, while the term "High VT" indicates RBB transistor biasing that causes the transistors in the corresponding circuit domain to have a relatively high threshold voltage and thus low leakage.

TABLE I

| Accuracy | VDD | FCLK | VT0 | VT1 | VT2 | VT3 |
|---|---|---|---|---|---|---|
| 16 bits | 0.8 V | 1.2 GHz | Low VT | Low VT | Low VT | Low VT |
| 16 bits | 0.8 V | 1 GHz | Low VT | Low VT | Low VT | Low VT |
| 16 bits | 1.0 V | 1.2 GHz | Low VT | Low VT | Low VT | High VT |
| 16 bits | 1.0 V | 1 GHz | Low VT | High VT | Low VT | High VT |
| 12 bits | 0.8 V | 1.2 GHz | Low VT | High VT | Low VT | Low VT |
| 12 bits | 0.8 V | 1 GHz | Low VT | High VT | Low VT | High VT |
| 12 bits | 1.0 V | 1.2 GHz | Low VT | High VT | Low VT | Low VT |
| 12 bits | 1.0 V | 1 GHz | High VT | High VT | Low VT | High VT |
| 8 bits | 0.8 V | 1.2 GHz | Low VT | High VT | High VT | High VT |
| 8 bits | 0.8 V | 1 GHz | Low VT | High VT | High VT | High VT |
| 8 bits | 1.0 V | 1.2 GHz | High VT | High VT | High VT | High VT |
| 8 bits | 1.0 V | 1 GHz | High VT | High VT | High VT | High VT |

Thus, in the case of an accuracy of 12 bits, an imposed supply voltage of 0.8 V and an imposed clock frequency of 1 GHz, the VT control signals VT0 and VT2 are for example set to "Low VT", and the VT control signals VT1 and VT3 are for example set to "High VT". In the case that the supply voltage and/or clock frequency are not imposed, the settings leading to lowest power consumption are for example selected. For example, this involves selecting the supply voltage VDD, clock frequency FCLK, and VT combination that provides the lowest power consumption.

In some embodiments, for each accuracy, the configurations are ranked from the one with lowest consumption to the one with highest consumption. This ranking may be indicated by the order of the rows in the lookup table, or by another means, such as an additional ranking value in the table. Therefore, based on whether the supply voltage and/or clock frequency is imposed, the configuration having the lowest power can be selected by simply selecting the highest ranking configuration for the required accuracy.

Additionally or alternatively, a separate lookup table may be provided for the case in which neither the supply voltage nor the clock frequency is imposed. This lookup table for example indicates, for each accuracy level, a single configuration corresponding to the one having the lowest power. Depending on the system capabilities, similar tables are for example provided for the case in which only the supply voltage and not the frequency is imposed, and for the case in which only the frequency and not the supply voltage is imposed.

Of course, while the example of Table 1 assumes three accuracy levels, in alternative embodiments there could be many more accuracy levels, for example covering some or all of the values from 8 to 32 bits. Furthermore, there could be more than two supply voltage levels, more than two clock frequency levels, and/or more than two VT levels.

The dynamic accuracy control circuit 108 for example generates, based on the VT settings obtained from the configuration memory 112, control signals to the VT controllers 106 causing them to generate the appropriate VT control signals VT0 to VT8. In some embodiments, the circuit 108 also sends control signals to a supply voltage and frequency control circuit (SUPPLY VOLTAGE AND FREQUENCY CONTROL) 114 causing it to apply an appropriate supply voltage VDD, and an appropriate clock signal FCLK, to the processing circuit 102. For example, in the case that the supply voltage and/or clock frequency settings are received as inputs, they are for example relayed by the circuit 108 to the circuit 114. If either or both of these settings is not provided as an input setting and is instead read from the configuration memory 112, the circuit 108 for example generates appropriate control signals to the circuit 114 for causing these settings to be applied.

In some embodiments, the dynamic accuracy control circuit 108 provides an output signal on a line 116 indicating when settings have been applied to the circuit domains 103 of the processing circuit 102, and its operation has become stable, such that it is ready to process data.

The dynamic accuracy control circuit 108 and supply voltage and frequency control circuit 114 are for example implemented in hardware. Alternatively, either or both of these circuits could be implemented in software executed by a suitable processor.

As will be described in more detail below with reference to FIGS. 10A, 10B and 10C, in some embodiments, one or more of the circuit domains 103 may assert a warning signal WARNING when a timing violation is close to occurring. Such a warning signal is for example used during a circuit characterization phase of the processing circuit 102 during which the VT settings in the configuration memory 112 are for example determined.

Operation of the circuit of FIG. 1 will now be described in more detail with reference to the flow diagram of FIG. 2.

Figure 2:
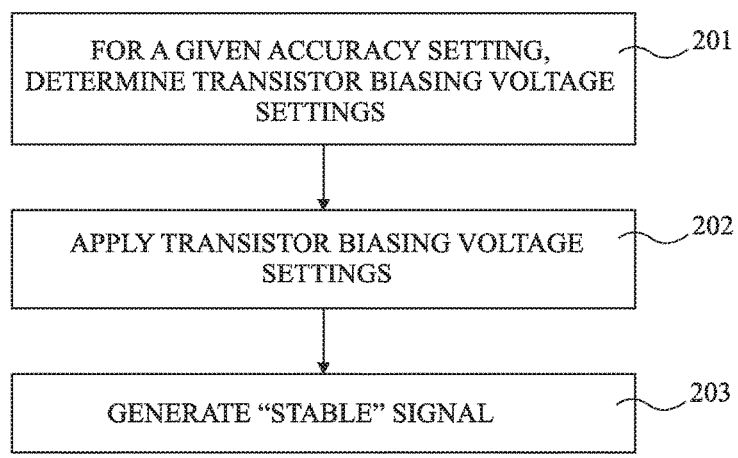
FIG. 2 is a flow diagram illustrating operations in a method of dynamic accuracy control based on the circuit of FIG. 1, according to an example embodiment.

FIG. 2 is a flow diagram illustrating operations in a method of dynamic accuracy control of a processing circuit according to an example embodiment.

In an operation 201, for a given accuracy setting indicated on the input line 110, the dynamic control circuit 108 for example determines transistor biasing voltage settings for each of the circuit domains by accessing the configuration memory 112. In some embodiments, a supply voltage setting and/or a clock frequency setting are also determined.

In an operation 202, the dynamic accuracy control circuit 108 applies the transistor biasing voltage settings, by causing the VT controllers 106 to send appropriate VT control signals to the circuit domains. In some cases, the circuit 108 also sets the frequency and/or voltage settings of the processing circuit via the voltage and frequency control circuit 114.

In an operation 203, the dynamic accuracy control circuit 108 for example generates a "stable" signal on the output line 116 when the VT settings have been applied and the operating conditions of the processing circuit have become stable. This for example indicates to one or more exterior circuits that the processing circuit 102 is ready for processing input data at the corresponding accuracy.

An advantage of the processing circuit 102 of FIG. 1 is that, by providing localized biasing to certain circuit domains, desired accuracy levels can be achieved with relatively low power consumption. Furthermore, the processing circuit can be modified in a dynamic manner based on the desired accuracy at any given time.

The processing circuit 102 is for example divided into circuit domains 103 in a manner such that, depending on the required accuracy, the performance of certain key portions of the processing circuit 102 can be boosted while allowing other portions of the processing circuit to remain at low speed and thus low power. One example of the division of the processing circuit 102 into the circuit domains 103 will now be described in more detail with reference to FIGS. 3 and 4.

Figure 3:
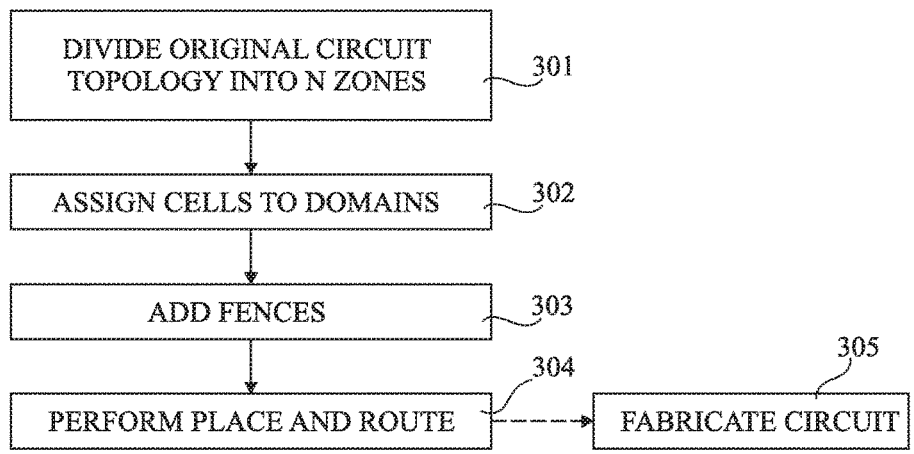
FIG. 3 is a flow diagram illustrating operations in a method of conception and fabrication of a processing circuit having multiple circuit domains according to an example embodiment.

FIG. 3 is a flow diagram illustrating operations in a method of dividing a processing circuit into regular circuit domains according to an example embodiment. This method is for example performed by a computing device described in more detail below.

In an operation 301, an original circuit topology of the processing circuit is for example divided into N zones of regular size and shape. For example, each zone is rectangular, although other shapes may be possible. The original circuit topology is for example the result of a place and route operation applied to a circuit design of the processing circuit resulting from a circuit synthesis process. The original circuit topology may include the control circuit 104 and the configuration memory 112, or these circuits may be added at a later stage.

Figure 4:
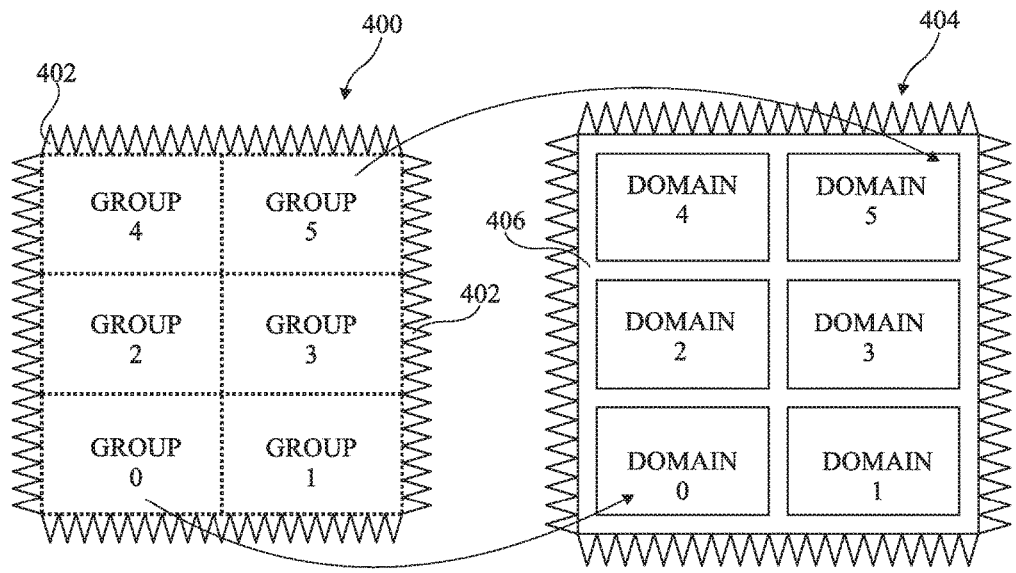
FIG. 4 schematically illustrates a step of assigning cells of a circuit topology to regular circuit domains according to an example embodiment.

FIG. 4 illustrates an example of an original circuit topology 400 of a processing circuit having input and output pins 402. As illustrated, the circuit topology 400 is for example divided into six groups of equal area, labelled Group 0 to Group 5. The division of the circuit topology into groups is performed by simply dividing the area of the circuit into N rectangular zones, the groups being defined by the cells that are positioned within each zone.

Referring again to FIG. 3, in an operation 302, the cells of each group are assigned to a corresponding circuit domain of a final circuit topology. For example, with reference to FIG. 4, a final circuit topology 404 is for example generated. The topology 404 is for example larger than the original circuit topology 400 to allow space for isolation fences between the circuit domains. Each of the circuit domains in the final circuit topology for example has the same size and shape as the corresponding zone in the original circuit topology so that the cell layouts fit within each circuit domain.

Referring again to FIG. 3, in an operation 303, isolation fences are for example added around the circuit domains in order to isolate them from neighbouring domains to allow independent biasing voltages to be applied to each circuit domain. With reference to FIG. 4, the isolation fences in the circuit topology 404 are represented by empty zones 406 surrounding each circuit domain. The isolation fences are for example formed by isolation trenches or other means allowing the circuit domains to receive independent transistor biasing voltages. Indeed, it is common for transistors to be formed in p-type and n-type wells formed as rows running across an integrated circuit. By at least adding isolation trenches running perpendicular to the wells and separating each well into two or more isolated portions, it becomes possible to apply independent biasing voltages to each well portion.

With reference again to FIG. 3, in an operation 304, place and route is for example performed in order to optimize the circuit placement and routing based on the final circuit topology that has been divided into domains. Indeed, the addition of the fences between circuit domains, and the spacing between the domains, may lead to changes in the circuit topology during the place and route procedure. These changes for example allow possible constraint violations created by the division of the circuit topology to be corrected by changing the design, such as by increasing cell size. In may also be possible to relax some parts of the circuit design, for example by decreasing the cell size. The input to this place and route operation is for example a netlist of cells forming the processing circuit, a definition of the zones of each circuit domain, and the assignment of each cell to a corresponding circuit domain.

With reference again to FIG. 3, the final circuit topology resulting from operation 304 is then for example stored to memory, and in some embodiments, in an operation 305, the circuit is fabricated based on the final circuit topology.

The fabrication process for example includes programming the configuration memory 112. The configuration memory 112 is for example a non-volatile memory, and the settings stored in this memory are for example generated during a circuit characterization phase, an example of which will now be described with reference to FIGS. 5 and 6.

Figure 5:
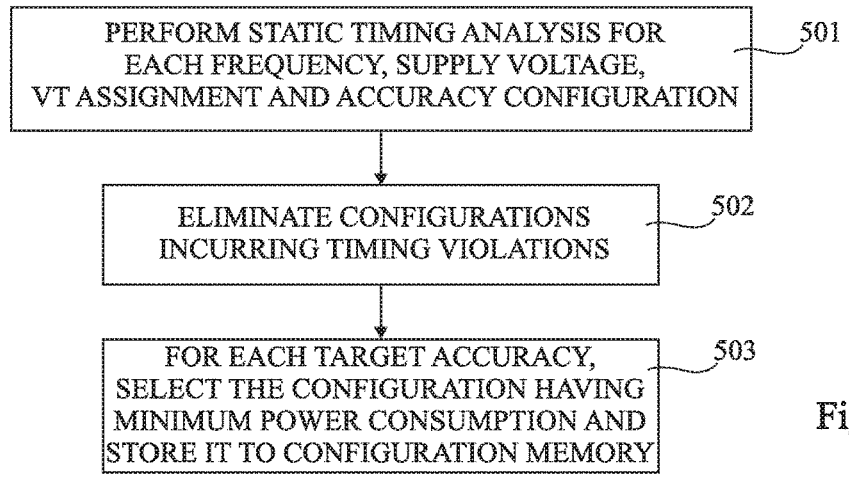
FIG. 5 is a flow diagram illustrating operations in a method of determining transistor biasing voltage settings of circuit domains according to an example embodiment.

FIG. 5 is a flow diagram illustrating steps in a method of determining transistor biasing voltage settings for a processing circuit divided into circuit domains according to an example embodiment. This method is for example performed by a computing device described in more detail below.

In an operation 501, static timing analysis (STA) is performed on the circuit topology for each possible configuration of clock frequency FCLK, supply voltage VDD, VT assignment, and accuracy. For each accuracy level, timing paths that are not relevant are for example excluded from the timing analysis. In particular, the paths receiving input bits that are not considered at the corresponding accuracy level, and the paths leading to output bits that are not generated at the corresponding accuracy level, are not considered. Taking the example of Table I above, static timing analysis is for example performed for the twelve combinations of accuracy, supply voltage VDD and clock frequency FCLK, and for the sixteen different configurations of the VT settings VT0 to VT3 for the four circuit domains, leading to a total of 192 different STA operations.

In an operation 502, all configurations that incur timing violations during the static timing analysis of operation 501 are for example eliminated.

In an operation 503, among the remaining configurations for each accuracy level, the one having the minimum power consumption is for example selected. Furthermore, in the case that the supply voltage and/or clock frequency can be imposed by the system, for each accuracy level, the configuration having minimum power for each supply voltage and/or clock frequency configuration is selected. This for example involves selecting the configuration for which the total power is lowest, measured for example from the chip, or estimated using a power analysis tool. The selected configurations are then for example used to generate a lookup table indicating the VT settings to be applied for each accuracy, and also for each supply voltage and/or clock frequency configuration if the system is capable of imposing either or both of these variables. This lookup table is for example stored in the configurations memory 112 of the fabricated circuit.

While FIG. 5 assumes the case in which both the supply voltage and clock frequency are capable of being set to one of several configurations, in alternative embodiments only one or neither of these variables is capable of being set, and the VT settings are thus defined only for the available configurations.

In the example of FIG. 5, depending on the number of available accuracy, supply voltage and clock frequency settings, and the number of circuit domains, the number of configurations to be analysed using static timing analysis may be very high. For example, in the case of a circuit divided into twelve circuit domains, even if each of these circuit domains has just two VT levels, this would still lead to over four thousand combinations of biasing voltages. Assuming that there are also the 16 configurations of accuracy, supply voltage and clock frequency of Table I above, this would lead to a total of over 60,000 configurations to be tested with static timing analysis. An alternative process that reduces the number of analysis operations will now be described with reference to FIG. 6.

Figure 6:
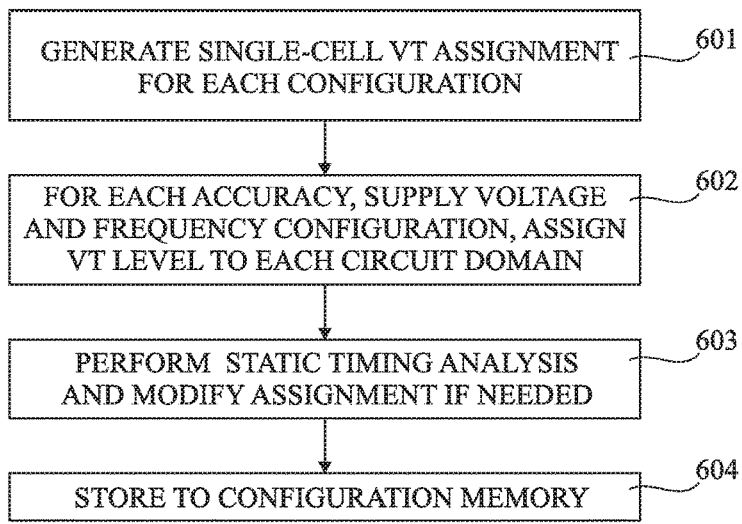
FIG. 6 is a flow diagram illustrating operations in a method of determining transistor biasing voltage settings according to an alternative example to that of FIG. 5.

FIG. 6 is a flow diagram illustrating an alternative method for determining biasing voltage configurations.

In an operation 601, a single-cell VT assignment is generated for the circuit topology 404, for each accuracy, supply voltage and clock frequency configuration. Single-cell VT assignment algorithms are known to those skilled in the art, and permit the selection of transistor VTs with the objective of ensuring correct operation of the circuit while optimizing for low power consumption. In particular, each cell can be implemented using one of at least two different models having different VT levels. For example there is a low-VT model and a high-VT model of each cell. For each cell, the algorithm performs a selection of the high-VT or low-VT model in order to achieve the lowest power consumption. Such single-cell VT assignment algorithms may be based on dual VT systems in which each cell can be implemented using just a high-VT model and a low-VT model, or multi-VT systems in which each cell may be implemented using more than two different models having different VT levels.

Examples of single-cell VT assignment algorithms are described in more detail in the publication by Wang, Q. and Vrudhula, S. B. K. entitled "Algorithms for Minimizing Standby Power in Deep Submicrometer, Dual-Vt CMOS circuits", IEEE transactions on Computer-Aided Design of Integrated Circuits and Systems, Vol. 21, No. 3, March 2002 in which the algorithm works at the sub-gate level (i.e. on individual transistors of each cell), and in the publication by Srivastava, A., entitled "Simultaneous Vt Selection and Assignment for Leakage Optimization", Proceedings of ISLPED'03, August 2003, in which the algorithm works at the gate level.

While, in such single-cell VT assignment algorithms, the different VT levels among the cell models are obtained by varying the physical characteristics of the transistors, such as the gate oxide thickness, or the channel length in FDSOI poly biasing, in operation 601, the different VT levels are obtained by assigning the cell a certain back biasing voltage. In other words, the single-cell VT assignment is performed as if it were possible to individually assign transistor biasing voltages to the cells, even if in reality this is not possible.

In an operation 602, for each accuracy, supply voltage and clock frequency configuration, a VT setting is assigned to each of the N circuit domains based on the single-cell VT assignment generated in operation 601. For example, this assignment is based on the VT level assigned to the majority of cells within each domain.

In an operation 603, static timing analysis is for example performed on each accuracy, supply voltage and clock frequency configuration. If any configuration incurs a timing violation, the VT assignment is for example modified until the static timing analysis is successful. For example, one process for implementing operations 602 and 603 for a given accuracy, supply voltage and clock frequency configuration could be as follows:

a) In operation 602, initially assign a high-VT level to all circuit domains;

b) In operation 602, then assign a low-VT level to the circuit domain having the largest number of low-VT cells according to the result of the single-cell VT assignment algorithm;

c) In operation 603, apply static timing analysis with the new VT assignment, and check whether all relevant paths for the given accuracy level meet timing constraints;

d) In operation 603, accept the new VT assignment if no timing violation is incurred. If a timing violation does occur, repeat step b) in which the circuit domain having the largest number of low-VT cells among the remaining domains is additionally assigned a low-VT level, and then steps c) and d) are repeated.

For each accuracy configuration, in a worst case, all circuit domains having at least one low-VT gate according to the single-cell VT assignment algorithm will be assigned the low-VT level. However, in practise, assigning a low-VT level to one or more circuit domains will cause the speed of a relatively large number of cells to be increased, meaning it will not be necessary to assign the low-VT level to every circuit domain.

While the example of FIGS. 3 and 4 relies on a regular division of the processing circuit into circuit domains, in some embodiments in which critical paths of a processing circuit are concentrated in one or more areas of the processing circuit, a non-regular division of the processing circuit into circuit domains can be performed as an alternative process, as will now be described with reference to FIGS. 7 and 8.

Figure 7:
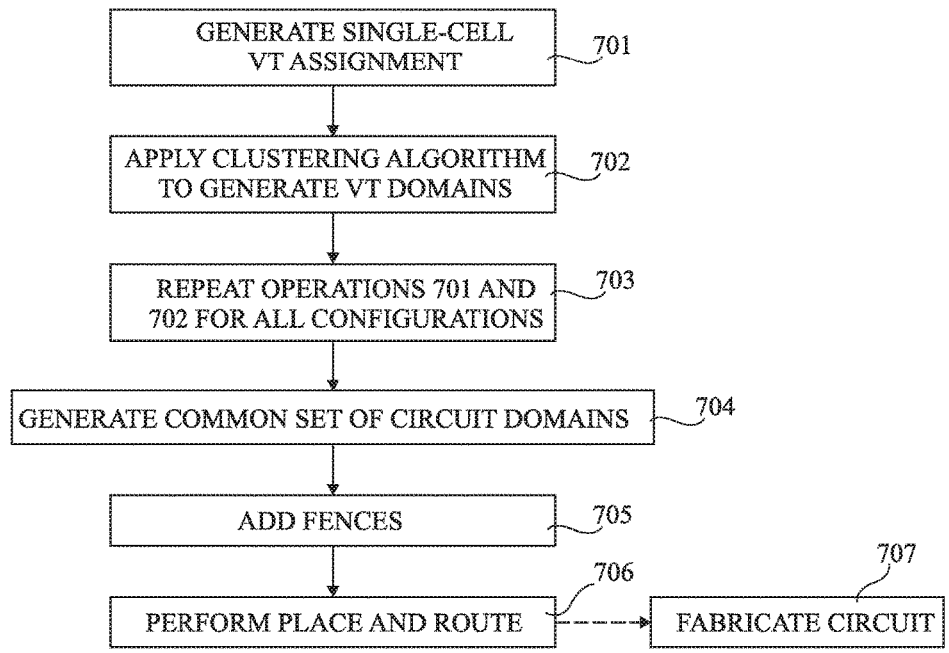
FIG. 7 is a flow diagram illustrating operations in a method of conception and fabrication of a processing circuit having multiple domains according to an example embodiment.

FIG. 7 is a flow diagram illustrating operations in a method of dividing a circuit into circuit domains according to an example embodiment. This method is for example performed by a computing device described in more detail below.

In an operation 701, a single-cell VT assignment is generated for the processing circuit topology, prior to any circuit domains being defined. This initial circuit topology for example results from a synthesis process including a place and route operation. As described in relation with operation 601 above, the single-cell VT assignment algorithm may be based on a dual VT system in which each transistor may be assigned to one of two VT levels, or multi-VT systems in which each transistor may be assigned to one of more than two different VT levels.

Figure 8:
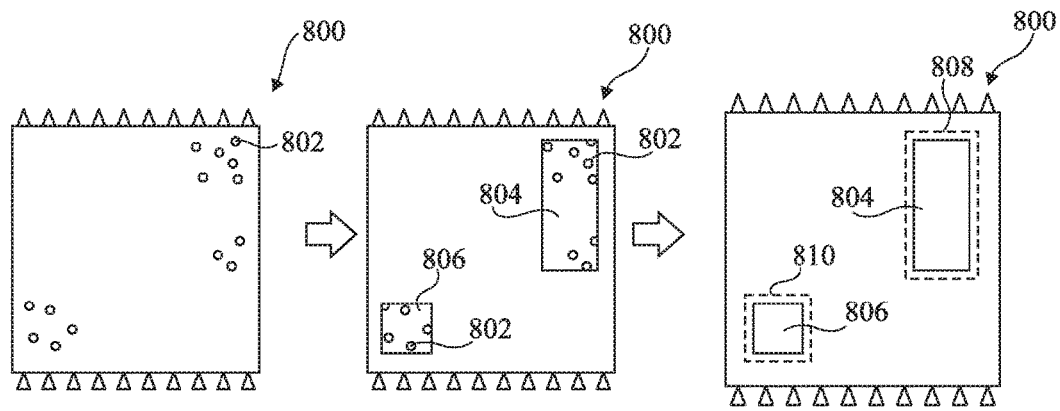
FIG. 8 schematically illustrates operations for defining non-regular circuit domains according to an example embodiment.

For example, with reference to FIG. 8, a processing circuit 800 is illustrated in the left of the figure in which a number of cells 802 have been assigned a low-VT level by the single-cell VT assignment algorithm.

Referring again to FIG. 7, in an operation 702, a clustering algorithm is for example applied in order to generate VT domains based on the generated single-cell VT assignment. For example, the clustering algorithm determines those cells clustered relatively close together and sharing a common assigned VT level, and which can thus be grouped together within a circuit domain. The clustering algorithm for example determines the location and size of each circuit domain. Of course, the clustering algorithm should prevent circuit domains from overlapping, and for example imposes a rectangular shape to the circuit domains, or at least a shape formed of straight edges.

For example, with reference to FIG. 8, the processing circuit topology 800 is illustrated in the middle of the figure in which the cells 802 assigned low-VT levels are grouped into two groups and rectangular circuit domains 804, 806 are defined containing each group of cells.

Referring again to FIG. 7, in an operation 703, the operations 701 and 702 are for example repeated for all accuracy, supply voltage, and clock frequency configurations, resulting in a set of circuit domains for each configuration.

In an operation 704, a common set of circuit domains is generated based on each of the sets of circuit domains generated in operations 701 to 703. For example, this may involve merging certain overlapping circuit domains defined for the various configurations, and splitting other circuit domains. In some embodiments, the total number of circuit domains may be limited to a certain number.

As an example, operations 703 and 704 may involve, after initially building a set of domains for a first configuration in operations 701 and 702, implementing the following algorithm:

1) For a next configuration, assume that the pre-existing set of domains already defined is present, and in operation 701, assign common VT levels to the cells in each pre-existing domain. For the cells outside of the pre-existing domains, perform individual cell VT assignment and clustering in operations 701 and 702 in order to add one or more additional domains to the set of domains;
2) Repeat operation 1) for a subsequent configuration, until all configurations have been processed.

In an operation 705, separation fences are added around the circuit domains.

For example, with reference to FIG. 8, assuming that the circuit domains 804, 806 are maintained in the final set of circuit domains, separation fences 808, 810 are for example respectively formed around them as shown in the right-hand side of the figure. Of course, there may be additional circuit domains not illustrated in FIG. 8.

With reference again to FIG. 7, in an operation 706, place and route is for example performed in order to optimize the connections within each circuit domain and between the circuit domains taking into account the addition of fences.

The final circuit topology resulting from the place and route operation 706 is then for example stored in a memory, and in some embodiments it may be fabricated in an operation 707.

Figure 9:
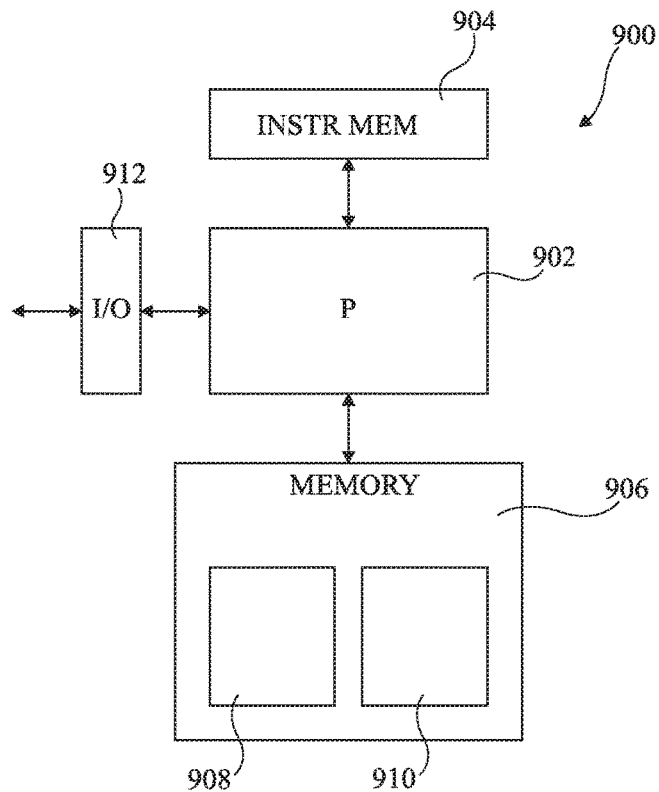
FIG. 9 schematically illustrates a computing device according to an example embodiment.

FIG. 9 schematically illustrates a computing device 900 that is for example capable of implementing the methods represented by the flow diagrams of FIGS. 3, 5, 6 and 7. The computing device 900 for example comprises a processing device (P) 902, which may comprise one or more processors under control of instructions stored in an instruction memory (INSTR MEM) 904. The computing device 900 also for example comprises a memory 906, which may be part of a same device as the instruction memory 904, or a separate device, storing a circuit topology 908 prior to division into circuit domains. The memory 906 also for example stores a final circuit topology 910, which is a circuit topology divided into separate circuit domains as described herein.

The processing device 902 is for example connected via an input/output interface (I/O) 912 to external systems allowing for example the final topology 910 to be transmitted to an external site for fabrication.

Figure 10A:
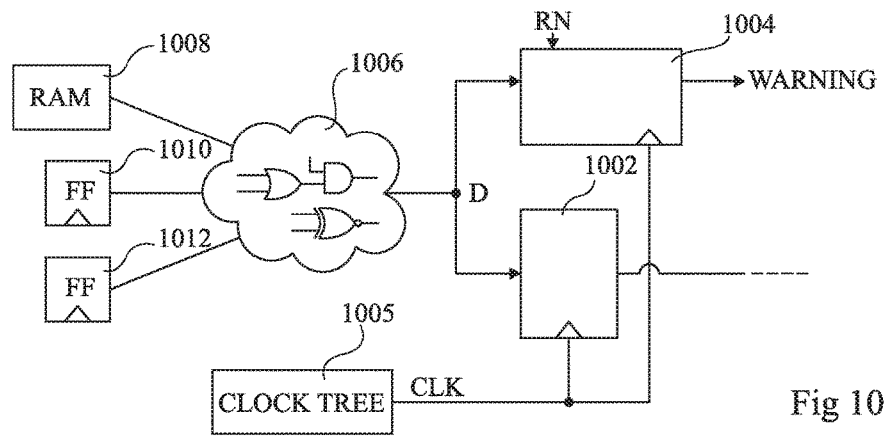
FIG. 10A schematically illustrates a portion of a circuit domain comprising a monitoring circuit according to an example embodiment.

FIG. 10A schematically illustrates part of one of the circuit domains 103 of FIG. 1 in the case that it is equipped with a monitoring circuit. In particular, a synchronous device 1002 of the circuit domain is equipped with a monitoring circuit 1004. The monitoring circuit 1004 provides a warning of a potential timing violation. The monitoring circuit 1004 receives a same clock signal CLK, generated for example by a clock tree (CLOCK TREE) 1005, and a same data signal D, as the synchronous device 1002 to be monitored. The monitoring circuit 1004 also for example receives a reset signal RN. In FIG. 10A, propagation paths to the device 1002 are represented by a cloud 1006 comprising combinational logic gates. Any of a broad range of synchronous devices may supply the combinational logic, and in the example of FIG. 10A there are three transmission paths leading to the synchronous device 1002, one coming from a random access memory (RAM) 1008 and the other two coming from flip-flops (FF) 1010, 1012.

Figure 10B:
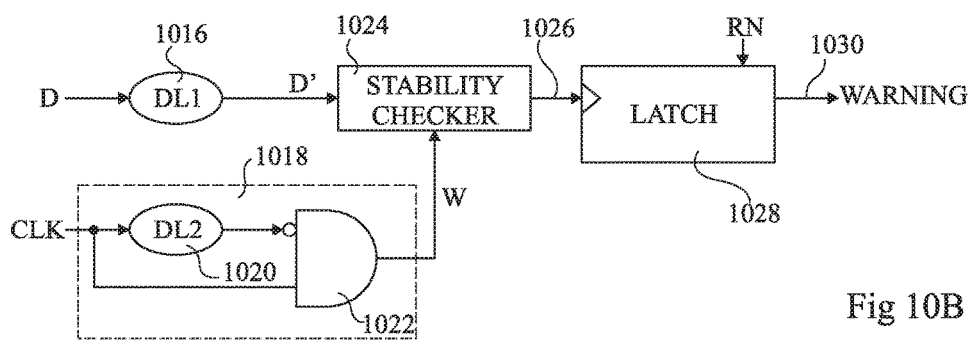
FIG. 10B schematically illustrates the monitoring circuit of FIG. 10A in more detail according to an example embodiment.

FIG. 10B schematically illustrates the monitoring circuit 1004 of FIG. 10A in more detail according to an example embodiment.

The input line receiving the data signal D is for example coupled to a delay element (DL1) 1016, which generates a delayed version D' of the data signal D. The clock input line is for example coupled to a pulse generator 1018, which generates a signal W comprising a pulse of a certain duration on each significant edge of the clock signal. For example, the pulse generator 1018 comprises a delay element (DL2) 1020 coupled to the clock input line, and having its output coupled via an inverter to one input of an AND gate 1022. The other input of AND gate 1022 is for example coupled to the clock input line.

The output of the delay element 1016 and the output of the pulse generator 1018 are coupled to a stability checker (STABILITY CHECKER) 1024, which is adapted to activate a signal on an output line 1026 if a transition of the data signal D' occurs during a pulse of the signal W. The output line 1026 is for example coupled to a latch (LATCH) 1028, which stores an activated state of the signal on the line 1026 until the reset signal RN is asserted, and asserts a warning signal (WARNING) on an output line 1030 of the latch. The warning signal is for example at a low level when deactivated and is activated to a high level, or is at a high level when deactivated, and is activated to a low level. For example, the latch 1028 has its data input (not illustrated in FIG. 10B) coupled to a high state, and is clocked by the line 1026 such that this high state is stored and outputted by the latch 1028 when the signal on line 1026 is activated.

Figure 10C:
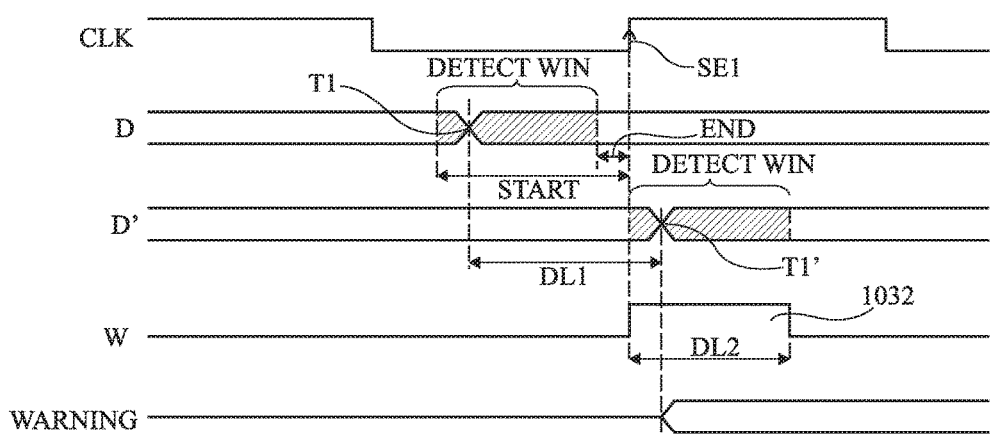
FIG. 10C is a timing diagram illustrating signals in the circuit of FIG. 10B according to an example embodiment.

FIG. 10C is a timing diagram illustrating the clock signal CLK, the data signals D and D', the signal W and the warning signal WARNING in the circuit of FIG. 10B according to an example embodiment.

As illustrated, the signal W has a high pulse 1032 starting shortly after a significant edge SE1 of the clock signal CLK and having a duration DL2 equal to the delay introduced by the delay element 1020 of the pulse generator 1018. The high pulse 1032 corresponds to a detection window (DETECT WIN) applied to the data signal D'. The data signal D' is delayed with respect to the data signal D by a time period DL1 introduced by delay element 1016, and thus the detection window applied to the signal D' is equivalent to applying a detection window to the data signal D starting at a time period START before the rising edge SE1, and ending at a time period END before the rising edge SE1, where START is equal to the time delay DL1, and END is equal to the difference DL2-DL1 between the time delays DL1 and DL2, which is for example negative if falling before the clock edge.

In the example of FIG. 10C, the data signal D has a transition T1 occurring during the detection window, and thus the warning signal WARNING is asserted shortly after the corresponding transition T1' of the data signal D'.

Thus the monitoring circuit 1004 provides an early warning of a timing violation. In some embodiments, such a monitoring circuit placed on one or more timing paths in each circuit domain 103 of the processing circuit may be used to replace the static timing analysis operations 501 and 603 of the methods of FIGS. 5 and 6 by indicating when timing violations are close to occurring, and allowing VT settings to be validated for a range of operating configurations.

An advantage of the embodiments described herein is that, by allowing transistor biasing voltages to be selected for a plurality of circuit domains independently of each other, it is possible to dynamically adjust the transistor biasing based on a desired accuracy of the processing circuit, and therefore provide correct operation with relatively low power consumption.

Furthermore, the phenomenon of the "wall-of-slack" can be avoided by allowing cells that have been optimized for low power and low area to be boosted independently using the local application of a transistor biasing voltage. Furthermore, while the supply voltage of the processing circuit may be configured to one of several levels, it is possible to apply a common supply voltage to the entire circuit and use only the transistor biasing voltages to boost performance, thereby avoiding the need of adding level shifters to each circuit domain.

Having thus described at least one illustrative embodiment, various alterations, modifications and improvements will readily occur to those skilled in the art. In particular, it will be apparent to those skilled in the art that while several examples have been described of methods for dividing a processing circuit into circuit domains, and for determining the VT settings to be applied to each circuit domain for a given accuracy configuration, other methods would be possible.

What is claimed is:

1. A circuit comprising:
a processing circuit comprising a plurality of circuit domains, each circuit domain comprising a plurality of transistors and being configured to apply one or more corresponding transistor biasing voltages to said transistors; and
a control circuit configured to determine, based on at least a selected accuracy setting of the processing circuit, the level of said one or more transistor biasing voltages to be applied in each of said circuit domains, the control circuit being further configured to cause said transistor biasing voltages to be applied to the circuit domains.

2. The circuit of claim 1, wherein the control circuit is configured to determine the level of said one or more biasing voltages based further on:
a supply voltage setting of all or part of the processing circuit; or
a frequency setting of all or part of the processing circuit; or
both a supply voltage setting and a frequency setting of all or part of the processing circuit.

3. The circuit of claim 1, further comprising:
a configuration memory storing, for a plurality of accuracy settings of the processing circuit, an indication of the level of said one or more transistor biasing voltages for each of the circuit domains, wherein the control circuit is adapted to access said configuration memory in order to determine the level of said one or more transistor biasing voltages to be applied by each of said circuit domains.

4. The circuit of claim 3, wherein the configuration memory further stores, for the plurality of accuracy settings, an indication of a supply voltage setting of all or part of the processing circuit and/or an indication of a frequency setting of all or part of the processing circuit.

5. The circuit of claim 1, further comprising a further control circuit adapted to apply a supply voltage setting and/or a clock frequency setting to the plurality of circuit domains.

6. A method of conception of the circuit of claim 1, comprising:
generating or receiving, by a processor of a computing device, a first circuit topology of the processing circuit, the first circuit topology defining a layout of cells forming the processing circuit;
generating, by the processor, a second circuit topology of the processing circuit comprising said plurality of circuit domains, and assigning the cells of the processing circuit to corresponding circuit domains of the plurality of circuit domains; and
storing, by the processor, the second circuit topology in a memory of the computing device.

7. The method of claim 6, further comprising fabricating the processing circuit based on the second circuit topology.

8. The method of claim 6, wherein generating the second circuit topology comprises:
dividing, by the processor, the area of the first circuit topology into N zones, where N is an integer of 2 or more equal to the number of circuit domains;
assigning, by the processor, the cells of the processing circuit in the first circuit topology to the corresponding circuit domains based on the location of each cell;

performing a place and route operation on the second circuit topology.

9. The method of claim 6, wherein generating the second circuit topology comprises:
   a) generating, by the processor and for a given accuracy configuration of the processing device, a single-cell threshold voltage assignment for cells forming the processing circuit in the first circuit topology;
   b) executing a clustering algorithm to group together cells of the single-cell biasing voltage assignment to define a set of circuit domains;
   c) repeating a) and b) for at least a plurality of accuracy configurations of the processing circuit; and
   d) generating a single set of circuit domains for the second circuit topology based on the set of circuit domains defined for each accuracy configuration.

10. The method of claim 6, further comprising storing to the configuration memory transistor biasing voltage settings to be applied to the circuit domains for each of a plurality of accuracy configurations.

11. The method of claim 10, further comprising generating the transistor biasing voltage settings based on static timing analysis.

12. A method of dynamically modifying accuracy of a processing circuit comprising a plurality of circuit domains, each circuit domain comprising a plurality of transistors, the method comprising:
   determining, by a control circuit based on at least a selected accuracy setting of the processing circuit, a level of one or more transistor biasing voltages for each of the plurality of circuit domains; and
   applying to the transistor devices of the plurality of circuit domains the one or more transistor biasing voltages.

* * * * *